United States Patent [19]

Prabhu et al.

[11] 4,377,642

[45] Mar. 22, 1983

[54] OVERGLAZE INKS

[75] Inventors: Ashok N. Prabhu, Plainsboro; Kenneth W. Hang, Princeton Junction, both of N.J.

[73] Assignee: RCA Corporation, New York, N.Y.

[21] Appl. No.: 280,920

[22] Filed: Jul. 6, 1981

[30] Foreign Application Priority Data

Oct. 17, 1980 [GB] United Kingdom ............... 8033566

[51] Int. Cl.$^3$ .............................................. H07K 3/28
[52] U.S. Cl. ...................................... 501/20; 501/22; 501/26
[58] Field of Search ............... 501/22, 20, 26; 427/96

[56] References Cited

U.S. PATENT DOCUMENTS

| 2,931,142 | 5/1960 | Veres | 501/22 |
| 3,480,566 | 11/1969 | Hoffman | 501/19 |
| 3,723,835 | 3/1973 | Davis | 501/22 |
| 3,778,242 | 12/1973 | Francel | 501/22 |
| 3,975,201 | 8/1976 | Greenstein | 501/22 |
| 4,256,796 | 3/1981 | Hang et al. | 428/210 |

FOREIGN PATENT DOCUMENTS

| 52-812 | 1/1977 | Japan | 501/22 |
| 1456478 | 11/1976 | United Kingdom | 501/22 |
| 446478 | 12/1974 | U.S.S.R. | 501/22 |
| 591527 | 12/1978 | U.S.S.R. | 501/22 |

*Primary Examiner*—John D. Smith
*Attorney, Agent, or Firm*—Birgit E. Morris; R. Hain Swope

[57] ABSTRACT

Improved thick-film overglaze inks useful in constructing multilayer integrated circuits on circuit boards, particularly porcelain-coated metal circuit boards, are provided. The subject inks comprise: a glass consisting of lead oxide, a modifier component consisting of the oxides of cadmium, zinc, barium and antimony and a glass-forming component consisting of aluminum oxide, boron trioxide and silicon dioxide; a suitable organic vehicle and, if desired, a colorant oxide.

6 Claims, No Drawings

OVERGLAZE INKS

This invention pertains to thick-film overglaze inks and their use as a protective layer for multilayer electrical circuit structures on porcelain-coated metal substrates.

BACKGROUND OF THE INVENTION

The use of specialized ink formulations to form thick films having various functions on suitable substrates in the construction of multilayer integrated circuit structures is well known in the art. Such technology is of increasing interest in the fabrication of very dense multilayer circuit patterns on various substrates for a wide variety of applications in the electronics industry.

Significantly improved substrates for the fabrication of such circuits are disclosed and claimed in Hang et al., U.S. Pat. No. 4,256,796, issued Mar. 17, 1981, the disclosure of which is incorporated herein by reference. The Hang et al. substrates are metal coated with an improved porcelain composition comprised of a mixture, based on its oxide content, of magnesium oxide (MgO) or mixtures of magnesium oxide and certain other oxides, barium oxide (BaO), boron trioxide ($B_2O_3$) and silicon dioxide ($SiO_2$). The preferred metal is steel, particularly low carbon steel, which may be coated with various other metals such as, for example, copper. The porcelain compositions are applied to the metal core and fired to provide a partially devitrified porcelain coating on the metal core. The coating has a very low viscosity at its initial fusion point and then almost instantaneously obtains a high viscosity due to devitrification. The fired coatings, which are preferred for hybrid circuit applications, have a deformation temperature of at least 700° C. and a high coefficient of thermal expansion of at least about $110 \times 10^{-7}/°C$.

While the porcelain metal substrates of Hang et al. represent a significant improvement over previously known substrate materials, they are disadvantageous only in being incompatible or poorly compatible with commercially available thick-film inks. With the development by us of novel inks compatible with the Hang et al. boards, there remained the need for an improved overglaze composition which would be compatible with the Hang et al. boards and with inks formulated therefor. Overglaze inks are utilized to provide mechanical and environmental protection for the portion of films of various functions predominately resistor and conductor films which is not otherwise covered, e.g., by components. Such an improved overglaze ink is provided in accordance with this invention.

SUMMARY OF THE INVENTION

The improved thick-film overglaze inks provided in accordance with this invention comprise a glass consisting of lead oxide, a modifier component consisting of the oxides of cadmium, zinc, barium and antimony, an aluminum borosilicate glass forming component, a colorant oxide, if desired, and a suitable organic vehicle.

DETAILED DESCRIPTION OF THE INVENTION

In accordance with this invention, there are provided improved overglaze inks useful in the production of complex single or multilayer thick-film circuits on porcelain metal circuit boards. While the overglaze inks of this invention are particularly useful in connection with circuits formed on the Hang et al. porcelain metal boards, they can be effectively utilized with conventional boards.

It is generally recognized that overglaze films formed from inks such as herein described should possess: a thermal coefficient of expansion reasonably close to the substrate being utilized and, preferably, also reasonably close to that of the various functional films making up the circuit; good mechanical strength; minimal porosity in general and no through porosity; and most importantly, good chemical compatibility with the underlying conductor and resistor films.

Although, in some instances, overglaze inks are fired at the same time as the underlying conductors and resistors for reasons of economy, they are generally independently fired at peak temperatures substantially below the firing temperature of conductor and resistor films. The overglaze inks of this invention are generally fired at peak temperatures of 475°–600° C. and are unique in that they can be fired in either air or, preferably, inert environments, e.g. nitrogen. Since most conventional inks are fireable in only one of these environments, the capacity of the subject inks to be fired in either is particularly advantageous in the production of highly complex multilayer circuits.

Overglaze inks conventionally contain lead oxide to lower the firing temperature substantially below that of the functional films already on the board. The inherent disadvantage in a high lead content, however, is that increasing the lead content of the ink also increases the probability of surface chemical reduction of the lead oxide when fired in an inert, e.g. nitrogen, atmosphere. Surface reduction of the lead oxide will interfere with sintering and reduce the flow of the ink. This latter problem is the more serious since an ink fired in nitrogen must flow as it would if fired in air.

It is also appreciated that an overglaze ink must not react to a significant extent with any part of the circuit on the board. This is particularly true with resistors since such reaction will normally have an adverse effect on the stability and resistance values of the resistors which have been carefully set, e.g. by trimming with a laser. To be acceptable, an overglaze film should not change the value of a resistor by more than five percent. A change of plus or minus two percent is the normal industry standard. Films formed from the novel overglaze inks of this invention readily fall within this standard acceptance criteria.

The novel overglaze inks of this invention comprise: a unique glass consisting of three components, i.e., lead oxide in an amount significantly below conventional levels for overglaze inks, a modifier component consisting of the oxides of cadmium, zinc, barium and antimony; and a glass forming component consisting of aluminum oxide, boron trioxide and silicon dioxide; a colorant oxide such as chromium oxide, cobalt oxide or nickel oxide, if desired; and a suitable organic vehicle. The subject inks contain, on a weight basis, from about 60 to about 90 percent, preferably from about 70 to about 85 percent, of the glass powder, up to about 5 percent, preferably from about 0.5 to about 2 percent of the colorant oxide, when one is present, and from about 8 to about 35 percent, preferably from about 14 to about 25 percent of the organic vehicle.

On a weight basis, the glass of the subject inks is comprised of from about 58 to about 66 percent, preferably from about 61 to about 63 percent of lead oxide; from about 12 to about 20 percent, preferably from about 13 to about 16 percent, of the modifier component; and from about 20 to about 27 percent, preferably from 22 to about 25 percent, of the glass forming component. It is necessary that all ingredients in each component be present in the glass composition.

The modifier component consists, on a weight basis, of from about 2 to about 6 percent, preferably about 4 percent, of cadmium oxide, from about 4 to about 8 percent, preferably about 7 percent, of zinc oxide, from about 0.1 to about 3 percent, preferably about 1 percent, of barium oxide; and from about 0.1 to about 3 percent, preferably about 2 percent, of antimony trioxide. It is the unique combination of oxides in the modifier component of the glass which makes possible the significant reduction in lead oxide in comparison to conventional usage without loss of essential properties of the subject inks.

The glass-forming component consists, on a weight basis, of from about 0.1 to about 2 percent, preferably 1 percent, of aluminum oxide, from about 14 to about 20 percent, preferably about 17 percent, of boron trioxide; and from about 1 to about 7 percent, preferably about 6 percent, of silicon dioxide.

The ink formulations of this invention may also contain a minor amount of a conventional colorant oxide such as the oxides of chromium, cobalt, nickel and the like.

The glass of the subject inks is initially formed by combining all of the oxides and fusing them at about 1,200° C. for from about 30 to 60 minutes. The glass is then solidified by cooling and ground to a powder having a particle size between about 1 and 5 micrometers. The glass powder is then combined with the colorant oxide, when one is present, and thoroughly mixed with the organic vehicle to make the ink. The organic vehicles are selected to give screen printing characteristics to the inks and to burn off cleanly during firing in nitrogen or air, i.e. without leaving a carbonaceous residue.

The organic vehicles are binders such as, for examples, cellulose derivatives e.g., ethyl cellulose, synthetic resins such as polyacrylates or methacrylates, polyesters, polyolefins and the like. In general, conventional vehicles utilized in inks of the type described herein may be used in the subject inks. Preferred commercially available vehicles include, for example, pure liquid polybutenes available as Amoco H-25, Amoco H-50 and Amoco L-100 from Amoco Chemicals Corporation, poly n-butylmethacrylate available from E. I. duPont de Nemours and Co., and the like.

The above resins may be utilized individually or in any combination of two or more. A suitable viscosity modifier can be added to the resin material if desired. These modifiers can be solvents such as those conventionally used in similar ink compositions, e.g. pine oil, terpineol, butyl carbitol acetate, an ester alcohol available from Texas Eastman Company under the trademark Texanol and the like, or solid materials such as, for example, a castor oil derivative available from N.L. Industries under the trademark Thixatrol.

The overglaze inks of this invention are applied to the substrate board, preferably the porcelain coated metal boards of Hang et al., to overlay a portion of single or multilayer electronic circuits already in place. The inks may be applied by any conventional mode, i.e. screen printing, brushing, spraying and the like, with screen printing being preferred. Generally, two layers of overglaze are utilized to minimize the possibility of pinholes and provide maximum protection. The layers are individually dried and fired. Each coating of ink is dried in air at 100°–125° C. for about 15 minutes. The resulting film may then be fired at a peak temperature of from 475° to 600° C., preferably at 500° to 525° C., for 5 to 15 minutes in either air or nitrogen. The overglaze films thus obtained have excellent mechanical strength, good reheat stability and a minimal effect on sheet resistance values of resistors in the circuit. The subject overglaze films have demonstrated a significant capacity to reduce resistance drifts due to abrasion, solder dipping and exposure to heat and humidity.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE 1

A glass powder was prepared by combining the following oxides in the weight percents given in parenthesis: PbO(62.0), CdO(4.0), ZnO(7.25), BaO(1.0), $Sb_2O_3$(2.0), $Al_2O_3$(1.0), $B_2O_3$(17.0), and $SiO_2$(5.75). The oxide mixture was heated to 1,200° to fuse it into a glass, allowed to cool and ground to a particle size of between about 1 and 5 micrometers. The glass powder was combined with an organic vehicle comprising a 13 percent by weight solution of a poly(isobutyl methacrylate) resin (duPont Elvacite Acrylic Resin 2045) in pine oil, and mixed in various proportions with the ester alcohol Texanol available from Texas Eastman Company. In the formulation including chromium oxide as a colorant, the chromium oxide was first mixed with the glass powder before combining with the organic vehicle. Inks having the following compositions were prepared:

| Ingredient | Formulation (Weight Percent) | |
|---|---|---|
| | A | B |
| Glass Powder | 76.19 | 74.07 |
| $Cr_2O_3$ | — | 1.85 |
| Elvacite 2045 in Pine oil | 20.00 | 19.44 |
| Texanol | 3.81 | 4.64 |

The powders were first mixed by hand and then on a 3 roll mill with shearing to obtain a smooth paste suitable for screen printing. Additional vehicle was added to replace loss during mixing, and to assure proper rheology. Indium oxide resistor inks were printed and fired onto a porcelain coated steel substrate of the type disclosed by Hang et al. The sheet resistance of each resistor was determined.

A predetermined portion of the resistor films was screen printed with formulation A above. The overglaze film was fired at 500° for 10 minutes. The sheet resistivity of the resistors was again measured to determine the effect, if any, of the overglaze coating. The results are reported in the following table.

TABLE

| Resistor No. | Sheet Resistivity K ohms/square | Percent Change After Glazing |
|---|---|---|
| 1 | 0.32 | 1.55 |
| 2 | 2.10 | 0.69 |
| 3 | 10.70 | 0.40 |

TABLE-continued

| Resistor No. | Sheet Resistivity K ohms/square | Percent Change After Glazing |
| --- | --- | --- |
| 4 | 201.00 | 0.94 |

Comparable results were obtained with formulation B. The overglaze films were also demonstrated to reduce resistance drifts due to abrasion, solder dipping and exposure to heat and humidity.

We claim:

1. An overglaze ink suitable for forming a protective film over an electrical circuit structure on a substrate comprising from about 60 to about 90 percent by weight of a glass powder, and from about 8 to about 35 percent by weight of a suitable organic vehicle, said glass powder consisting essentially of:
   (a) from about 58 to about 66 percent by weight of lead oxide;
   (b) from about 12 to about 20 percent by weight of a modifier component consisting of from about 2 to about 6 percent by weight of cadmium oxide, from about 4, to about 8 percent by weight of zinc oxide, from about 0.1 to about 3 percent by weight of barium oxide and from about 0.1 to about 3 percent by weight of antimony trioxide; and
   (c) from about 20 to about 27 percent by weight of a glass forming component consisting of from about 0.1 to about 2 percent by weight of aluminum oxide, from about 14 to about 20 percent by weight of boron trioxide and from about 1 to about 7 percent by weight of silicon dioxide.

2. An overglaze ink in accordance with claim 1 comprising from about 70 to about 85 percent by weight of said glass powder and from about 14 to about 25 percent by weight of said organic vehicle.

3. An overglaze ink in accordance with claim 1, wherein said glass powder consists of from about 61 to about 63 by weight of lead oxide, from about 13 to about 16 by weight of said modifier component and from about 22 to about 25 percent by weight of said glass-forming component.

4. An overglaze ink in accordance with claim 3 or 5, wherein said glass consists of:
   (a) about 62 percent by weight of lead oxide;
   (b) a modifier component consisting of about 4 percent by weight of cadmium oxide, about 7 percent by weight of zinc oxide, about 1 percent by weight of barium oxide and about 2 percent by weight of antimony trioxide; and
   (c) a glass-forming component consisting of about 1 percent by weight of aluminum oxide, about 17 percent by weight of boron trioxide and about 6 percent by weight of silicon dioxide.

5. An overglaze ink in accordance with claim 1, wherein said ink contains up to about 5 percent by weight of a colorant oxide selected from the group consisting of chromium oxide, cobalt oxide and nickel oxide.

6. An overglaze ink in accordance with claim 5, wherein said ink contains from about 0.5 to about 2 percent by weight of said colorant oxide.

* * * * *

UNITED STATES PATENT AND TRADEMARK OFFICE
CERTIFICATE OF CORRECTION

PATENT NO. : 4,377,642

DATED : March 22, 1983

INVENTOR(S) : Ashok Narayan Prabhu et al.

It is certified that error appears in the above-identified patent and that said Letters Patent is hereby corrected as shown below:

Col. 6, line 13 delete "or 5".

Signed and Sealed this

Twenty-fourth Day of May 1983

[SEAL]

Attest:

DONALD J. QUIGG

*Attesting Officer*     *Acting Commissioner of Patents and Trademarks*